United States Patent
Rossmeisl et al.

(10) Patent No.: US 6,324,973 B2
(45) Date of Patent: *Dec. 4, 2001

(54) METHOD AND APPARATUS FOR DISPENSING MATERIAL IN A PRINTER

(75) Inventors: Mark Rossmeisl, Franklin; Gary T. Freeman, Beverly; Robert Balog, North Attleboro, all of MA (US)

(73) Assignee: Speedline Technologies, Inc., Franklin, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/235,034

(22) Filed: Jan. 21, 1999

Related U.S. Application Data

(63) Continuation-in-part of application No. 08/966,057, filed on Nov. 7, 1997, now Pat. No. 5,947,022.

(51) Int. Cl.[7] .................................................. B05C 17/04
(52) U.S. Cl. ......................... 101/123; 101/129; 101/366; 222/234
(58) Field of Search ................................... 101/114, 119, 101/120, 123, 124, 129, 366; 118/213, 406, 422, 429, 241, 242, 256; 222/234; 427/282; 226/146

(56) References Cited

U.S. PATENT DOCUMENTS 2,382,920   11/1945   Schaefer .
2,571,064   11/1951   Schaefer .
3,037,457    6/1962   Sternlight .
3,097,554    7/1963   Rice et al. .
3,463,363    8/1969   Zelna .................................. 222/334
3,804,011    4/1974   Zimmer .
3,921,520   11/1975   Zimmer .
3,921,521   11/1975   Kudlich .

(List continued on next page.)

FOREIGN PATENT DOCUMENTS 19541996    5/1997   (DE) .
 0598182    5/1994   (EP) .
 96.12671  10/1996   (FR) .
 2279899    1/1995   (GB) .
 2298393    9/1996   (GB) .
WO96/20088   7/1996   (WO) .

OTHER PUBLICATIONS

PCT International Search Report dated Jun. 27, 2000.

*Primary Examiner*—Ren Yan
(74) *Attorney, Agent, or Firm*—Mintz, Levin, Cohn, Ferris, Glovsky and Popeo, P.C.

(57) ABSTRACT

A printer for printing a viscous material at predetermined positions forming a pattern on a substrate. The printer includes a frame, a device, mounted to the frame, having a number of perforations arranged to form the pattern, a support apparatus, coupled to the frame, that supports the substrate in a printing position beneath the device, and a material dispenser. The material dispenser has a chamber to contain the viscous material to be printed on the substrate. The chamber has an opening through which the viscous material is dispensed. The material dispenser is coupled to the frame, positioned over the device, and constructed and arranged to dispense the viscous material through the perforations in the device and onto the substrate. The material dispenser has a retraction device that prevents leakage of the viscous material from the opening after dispensing is complete.

18 Claims, 12 Drawing Sheets

U.S. PATENT DOCUMENTS

| | | |
|---|---|---|
| 3,965,817 | 6/1976 | Ipek . |
| 4,023,486 | 5/1977 | Linthicum et al. . |
| 4,032,046 * | 6/1977 | Elliott et al. .......................... 222/146 |
| 4,043,683 | 8/1977 | Costa et al. . |
| 4,075,089 | 2/1978 | Saari et al. . |
| 4,485,736 | 12/1984 | Strutz, Jr. et al. . |
| 4,622,239 * | 11/1986 | Schoenthaler et al. ................ 427/96 |
| 4,636,406 * | 1/1987 | Leicht .................................... 427/96 |
| 4,715,278 | 12/1987 | Ericsson . |
| 4,720,402 * | 1/1988 | Wojcik ................................ 427/282 |
| 4,942,998 | 7/1990 | Horvath et al. ..................... 228/102 |
| 4,961,955 | 10/1990 | Goldberg . |
| 5,044,306 | 9/1991 | Erdmann . |
| 5,050,496 | 9/1991 | Klemm . |
| 5,050,498 * | 9/1991 | Smith ................................ 101/127.1 |
| 5,287,806 | 2/1994 | Nanzai . |
| 5,309,837 | 5/1994 | Nanzai . |
| 5,364,011 | 11/1994 | Baker et al. . |
| 5,395,643 | 3/1995 | Brown et al. . |
| 5,407,488 | 4/1995 | Ray . |
| 5,454,655 | 10/1995 | Tani . |
| 5,553,540 | 9/1996 | Tani . |
| 5,640,907 * | 6/1997 | Tani et al. ........................... 101/366 |
| 5,802,970 * | 9/1998 | Tani .................................... 101/123 |
| 5,806,423 * | 9/1998 | Tani .................................... 101/123 |
| 5,947,022 * | 9/1999 | Freeman et al. ..................... 101/123 |

* cited by examiner

METHOD AND APPARATUS FOR DISPENSING MATERIAL IN A PRINTER

RELATED APPLICATIONS

This application is a continuation in part of U.S. patent application Ser. No. 08/966,057, filed Nov. 7, 1997, now U.S. Pat. No. 5,947,022, which is incorporated herein by reference.

FIELD OF THE INVENTION

The present invention relates to an apparatus and process for dispensing material, and more specifically to an apparatus and process for dispensing solder paste in a screen or stencil printer.

BACKGROUND OF THE INVENTION

In typical surface-mount circuit board manufacturing operations, a stencil printer is used to print solder paste onto a circuit board. Typically, a circuit board having a pattern of pads or some other, usually conductive, surface onto which solder paste will be deposited is automatically fed into the stencil printer and one or more small holes or marks on the circuit board, called fiducials, is used to properly align the circuit board with the stencil or screen of the stencil printer prior to the printing of solder paste onto the circuit board. In some prior art systems, an optical alignment system is used to align the circuit board with the stencil. Examples of optical alignment systems for stencil printers are described in U.S. Pat. No. 5,060,063, issued Oct. 21, 1991 to Freeman, and in U.S. Pat. Re. No. 34,615, issued Jan. 31, 1992, also to Freeman, each of which is incorporated herein by reference.

Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the board. As the squeegee is moved across the stencil, the solder paste tends to roll in front of the blade, which desirably causes mixing and shearing of the solder paste so as to attain desired viscosity to facilitate filling of the apertures in the screen or stencil. The solder paste is typically dispensed onto the stencil from a standard cartridge such as that manufactured by SEMCO Corporation.

In some prior art stencil printers, any excess solder paste remaining under the squeegee after it has fully traversed the stencil, remains on the stencil when the squeegee is returned to its initial position for printing on a second circuit board. In some prior art screen printers, a second squeegee is used that moves across the stencil in the direction opposite to that of the first squeegee. The first squeegee and the second squeegee are used on alternating boards to continually pass the roll of solder paste over the apertures of a stencil to print each successive circuit board. In the prior art stencil printers that utilize two squeegees, there is still the problem that at the end of a manufacturing day, or when the stencil is to be changed, excess solder paste typically remains on the stencil and must be manually removed. Also, in these prior art printers, it is difficult to maintain a desirable viscosity because volatile solvents escape from the solder paste thereby affecting the viscosity of the solder paste.

In the prior art stencil printers discussed above, the squeegee blades are typically at a predetermined angle with the stencil to apply downward pressure on the solder paste to force the solder paste through the apertures in the stencil as the squeegee is moved across the stencil. The angle of the blade is selected based on the speed at which the blade traverses the stencil and based on the desired downward pressure on the solder paste from the blade. It is desirable to maintain a consistent pressure on the solder paste as the squeegee traverses the stencil, however, in typical prior art printers, the pressure varies due to variations in paste viscosity throughout a production run, and due to variations in the angle of the squeegee caused by deformation of the squeegee due to the pressure applied by the squeegee driving device.

It is desirable to provide a method and apparatus for dispensing material onto a stencil of a printer that overcome the problems discussed above.

SUMMARY OF THE INVENTION

Embodiments of the present invention provide methods for dispensing material and stencil printers having a dispensing apparatus that overcome the problems of the prior art discussed above.

In a first embodiment of the present invention, a printer for printing a viscous material at predetermined positions forming a pattern on a substrate is provided. The printer includes a frame, a device, mounted to the frame, having a number of perforations arranged to form the pattern, a support apparatus, coupled to the frame that supports the substrate in a printing position beneath the device, and a material dispenser having a substantially cylindrical chamber to contain viscous material to be printed on the device. The chamber has an opening through which the viscous material is dispensed. The material dispenser is coupled to a frame, positioned over the device, and constructed and arranged to dispense the viscous material through the perforations in the device and onto the substrate.

Alternate versions of the first embodiment of the present invention include a number of different features. In one version, the material dispenser is constructed and arranged to be movable along a first axis across the device while the viscous material is being dispensed from the chamber. In another version, the chamber has a cylindrical axis extending along a length of the chamber, and the interior surface of the chamber is coated with a coating material having a low coefficient of friction to allow mixing of the viscous material within the chamber when the material dispenser is moved across the device. In alternate embodiments, different coatings having both high and low coefficients of friction may be used on the interior surface of the chamber to enhance the laminar flow of material in the chamber.

In another version of the first embodiment, the printer further includes a heater to heat the viscous material or a cooler to cool the material, and the material dispenser includes at least one port to receive pressurized paste to increase the paste pressure in the chamber to force viscous material from the chamber.

In yet another version of the first embodiment, the material dispenser further includes a pressure sensor that senses pressure within the chamber, and the printer further includes a controller, coupled to the pressure sensor, that senses the pressure within the chamber and maintains the pressure at a desired value.

In another version of the first embodiment, the material dispenser is adapted to receive a removable cartridge, and in some versions, the removable cartridge is a standard SEMCO cartridge.

In still another version of the first embodiment, the material dispenser includes a pair of inwardly facing blades with side dams that contact the device during printing to prevent excess material from accumulating on the device.

In another version of the first embodiment, the printer further includes a solder gathering squeegee arm that collects excess viscous material remaining on the device when the material dispenser is lifted off of the device.

In a second embodiment of the present invention, a printer for printing a viscous material at predetermined positions forming a pattern on a substrate is provided. The printer includes a frame, a device, mounted to the frame, having a number of perforations arranged to form a pattern, a support apparatus that supports the substrate in a printing position beneath the device, and a material dispenser having a chamber to contain the viscous material to be printed on the substrate. The chamber has an opening through which the viscous material is dispensed. The material dispenser is positioned over the device, constructed and arranged to dispense the viscous material through the perforations in the device and onto the substrate, and adapted to receive a removable cartridge that supplies the viscous material to the chamber. The chamber has an inlet adapted to receive the viscous material from the removable cartridge.

Alternate versions of the second embodiment of the present invention may include one or more of the features of versions of the first embodiment discussed above.

A third embodiment of the present invention provides a material dispenser for dispensing a viscous material onto a stencil of a printer. The material dispenser includes a substantially cylindrical chamber to contain the viscous material. The chamber has an opening through which the viscous material is dispensed. The material dispenser also includes a pair of inwardly facing blades and side dams mounted on the material dispenser in close proximity to the opening. The blades are adapted to contact the stencil during printing to prevent excess material from remaining on the device.

In one version of the material dispenser, an interior surface of the chamber is coated with a coating material having a low coefficient of friction to allow mixing of the viscous material within the chamber when the material dispenser is moved across the device.

A fourth embodiment of the present invention provides a printer for printing a viscous material at predetermined positions forming a pattern on a substrate. The printer includes a frame, a device, mounted to the frame, having a number of perforations arranged to form the pattern, a support apparatus, coupled to the frame, that supports the substrate in a printing position beneath the device and a material dispenser having a chamber to contain the viscous material to be printed on the substrate. The chamber has an opening through which the viscous material is dispensed. The material dispenser is coupled to the frame, positioned over the device, and constructed and arranged to dispense the viscous material through the perforations in the device and onto the substrate. The material dispenser has a retraction device that prevents leakage of the viscous material from the opening after dispensing is complete.

In one version, the retraction device includes at least one plunger that is extendable into the chamber to vary the volume of the chamber, and the retraction device can include an actuator coupled to the plunger to control movement of the plunger. The actuator may have a first air inlet and a second inlet, and the actuator can be constructed and arranged to provide movement of the plunger in a first direction upon the application of pressurized air at the first inlet and to provide movement of the plunger in a second direction upon the application of pressurized air at the second inlet.

In versions of the fourth embodiment, the material dispenser can include at least one port to receive pressurized air to provide air pressure to the chamber to force the viscous material from the chamber during dispensing, and the material dispenser can include a pressure sensor to sense pressure within the chamber, and the printer can further include a controller coupled to the pressure sensor that senses the pressure within the chamber and controls the pressurized air provided through the port to maintain the pressure within the chamber at a desired value. The printer can be adapted to receive a removable cartridge that supplies the viscous material to the chamber, and the chamber can have an inlet to receive the viscous material from the removable cartridge. The pressurized air can be provided to the cartridge to force the viscous material from the cartridge into the chamber.

In a fifth embodiment, a printer is provided for printing a viscous material at predetermined positions forming a pattern on a substrate. The printer includes a frame, a device, mounted to the frame, having a number of perforations arranged to form the pattern, a support apparatus, coupled to the frame, that supports the substrate in a printing position beneath the device, and a material dispenser having a chamber to contain the viscous material to be printed on the substrate. The chamber has an opening through which the viscous material is dispensed, and the material dispenser is coupled to the frame, positioned over the device, and constructed and arranged to dispense the viscous material through the perforations in the device and onto the substrate. The printer also includes means for retaining the viscous material in the chamber after dispensing is complete.

In versions of the fifth embodiment, the means for retaining include means for increasing a volume of the chamber, and the material dispenser is adapted to receive a removable cartridge that supplies the viscous material to the chamber, the chamber having an inlet to receive the viscous material from the removable cartridge. The printer can further include means for applying pressure to the viscous material in the cartridge to force viscous material into the chamber from the cartridge and to force viscous material from the chamber through the opening.

In a sixth embodiment of the present invention, a method is provided for printing a pattern of viscous material on a substrate using a dispenser having a chamber with an inlet to receive viscous material and an outlet from which viscous material is dispensed. The method includes steps of positioning the dispenser over the substrate, applying pressure to the viscous material in the chamber to dispense viscous material from the outlet of the chamber onto the substrate, relieving the pressure applied to the viscous material to discontinue dispensing, and expanding the volume of the chamber to retain the viscous material in the chamber.

The method of the sixth embodiment can further include steps of decreasing the volume of the chamber prior to dispensing material onto the substrate, and coupling a removable cartridge containing the viscous material to the dispenser such that an outlet of the removable cartridge is coupled to the inlet of the chamber. In versions of the sixth embodiment, in the step of applying pressure, air pressure is supplied to the removable cartridge.

BRIEF DESCRIPTION OF THE DRAWINGS

For a better understanding of the present invention, reference is made to the drawings which are incorporated herein by reference and in which.

DETAILED DESCRIPTION

For purposes of illustration, embodiments of the present invention will now be described with reference to a stencil printer used to print solder paste onto a circuit board. One skilled in the art will appreciate, however, that embodiments of the present invention are not limited to stencil printers that print solder paste onto circuit boards, but rather, may be used in other applications requiring dispensing of other viscous materials such as glues and encapsulents. Further, stencil printers in accordance with embodiments of the present invention are not limited to those that print solder paste on circuit boards, but rather, include those used for printing other materials on a variety of substrates. Also, the terms screen and stencil may be used interchangeably herein to describe a device in a printer that defines a pattern to be printed onto a substrate.

Figure 1:
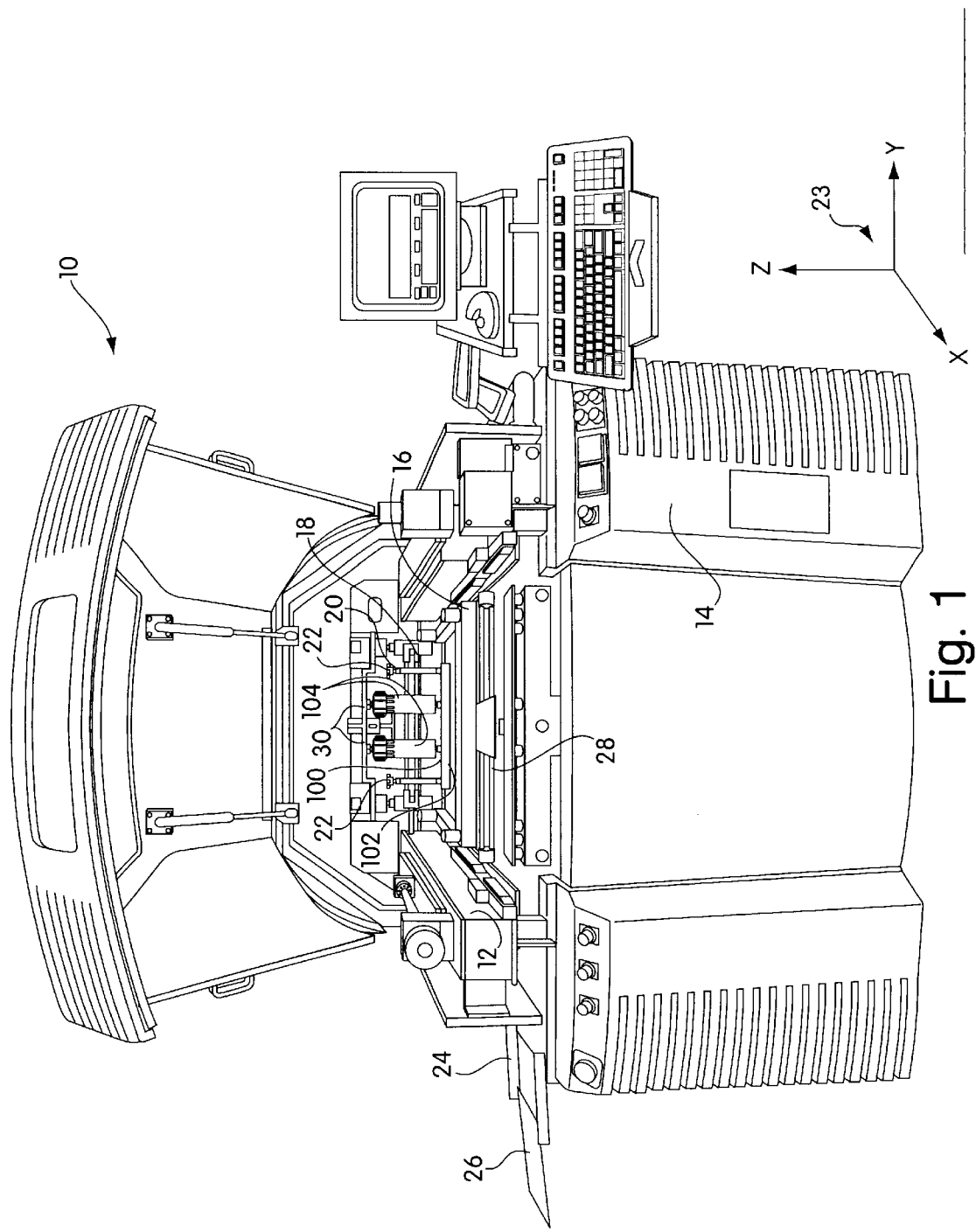
FIG. 1 provides a front view of a stencil printer in accordance with one embodiment of the present invention.
Figure 2:
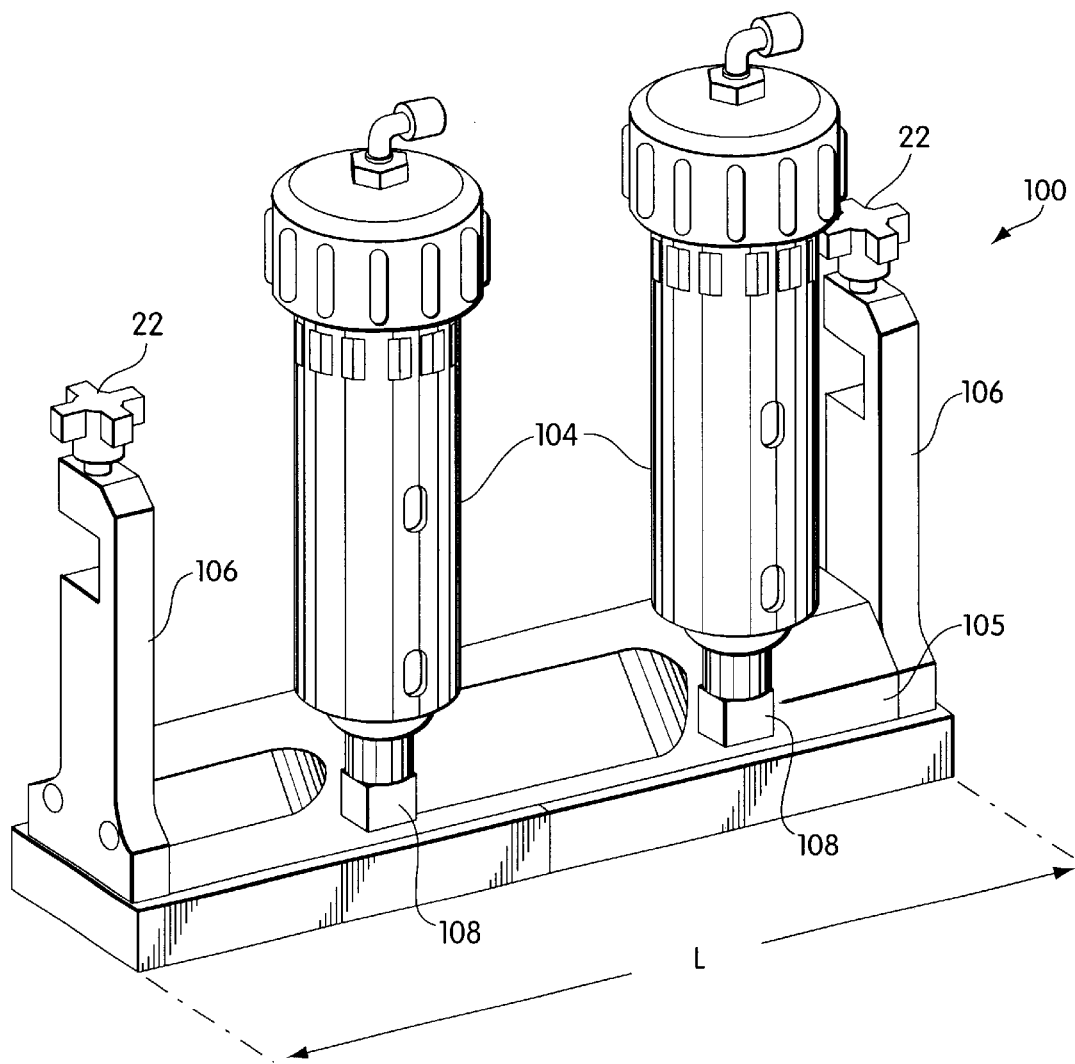
FIG. 2 provides a perspective view of a material dispensing head used in the stencil printer of FIG. 1.
Figure 3:
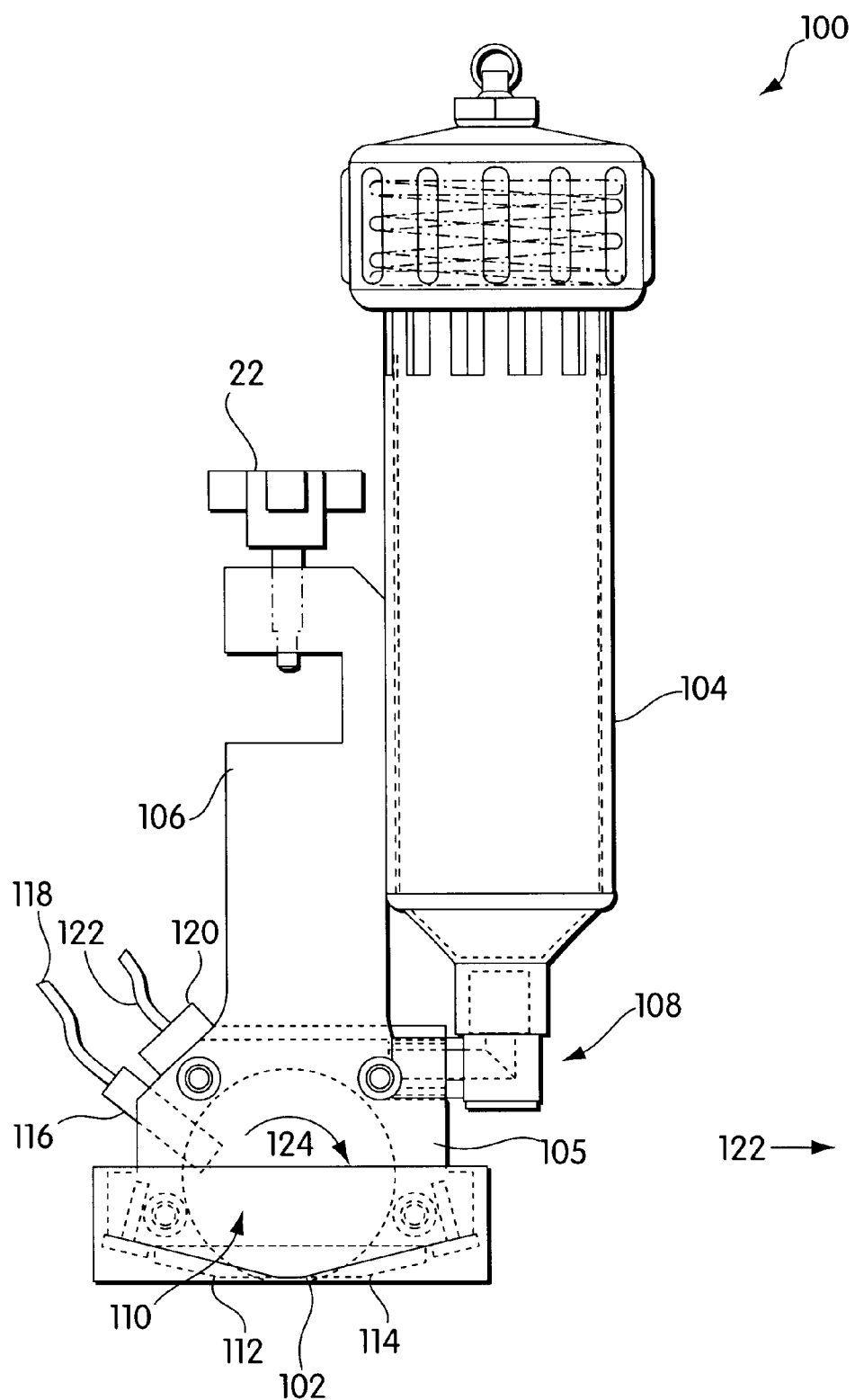
FIG. 3 provides a cross-sectional side view of the material dispensing head shown in FIG. 2.
Figure 4:
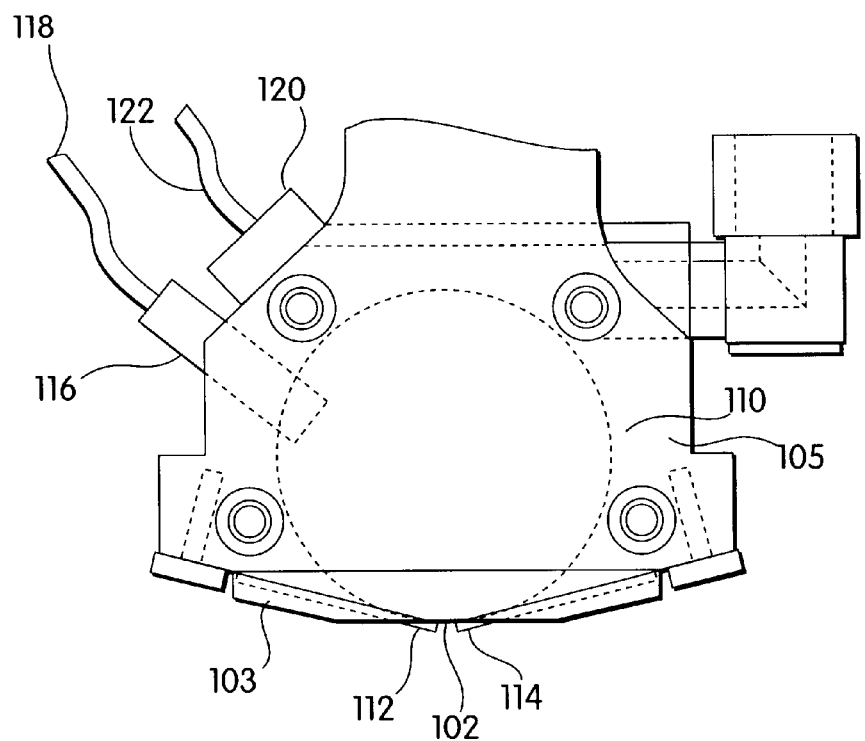
FIG. 4 shows a close up side view of a chamber of the material dispenser of FIG. 2.
Figure 5:
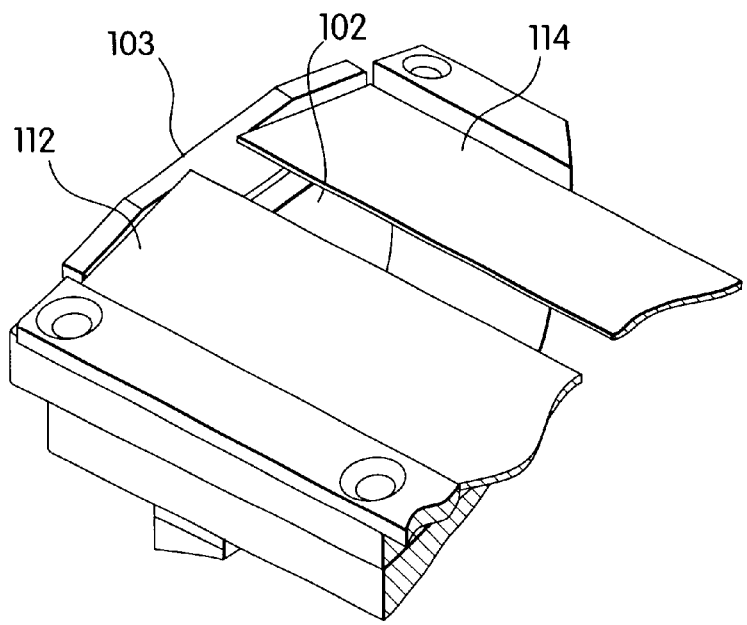
FIG. 5 shows a bottom view of the material dispenser in greater detail.

FIG. 1 shows a front view of a stencil printer 10 in accordance with one embodiment of the present invention. The stencil printer 10 includes a frame 12 that supports components of the stencil printer including a controller 14, a stencil 16, and a dispensing head 100 having a dispensing slot 102 from which solder paste may be dispensed.

The dispensing head 100 is coupled to a first plate 18 using two thumbscrews 22. The first plate 18 is coupled to a second plate 20 which is coupled to the frame 12 of the stencil printer 10. The first plate 18 is coupled to the second plate 20 in such a manner that the first plate can be moved with respect to the second plate along a z axis, the z axis being defined by the coordinate axis system 23 shown in FIG. 1. The first plate is moved by motors under the control of the controller 14.

The second plate 20 is movably coupled to the frame 12 such that the second plate 20 can move with respect to the frame 12 along an x axis, the x axis also being defined by the coordinate axis system 23. As described below in further detail, the movements of the first and second plates allow the dispensing head 100 to be placed over the stencil 16 and moved across the stencil to allow printing of solder paste onto a circuit board.

Stencil printer 10 also includes a conveyor system having rails 24 for transporting a circuit board 26 to a printing position in the stencil printer. The stencil printer has a number of pins 28, positioned beneath the circuit board when the circuit board is in the dispensing position. The pins are used to raise the circuit board 26 off of the rails 24 to place the circuit board in contact with, or in close proximity to, the stencil 16 when printing is to occur.

The dispensing head 100 is configured to receive two standard SEMCO three ounce or six ounce solder paste cartridges 104 that provide solder paste to the dispensing head during a printing operation. Each of the solder paste cartridges 104 is coupled to one end of a pneumatic air hose 30. As readily understood by those skilled in the art, the dispensing head could be adapted to receive other standard, or non-standard, cartridges. The other end of each of the pneumatic air hoses is attached to a compressor that under the control of the controller 14 provides pressurized air to the cartridges to force solder paste to flow from the cartridges into the dispense head 100 and onto the screen 16. Mechanical devices, such as a piston, may be used in addition to, or in place of, air pressure to force the solder paste from the SEMCO cartridges into the dispensing head.

In one embodiment of the present invention, the controller 14 is implemented using a personal computer using the Microsoft DOS or Windows® NT operating system with application specific software to control the operation of the stencil printer as described herein.

The stencil printer 10 operates as follows. A circuit board 26 is loaded into the stencil printer using the conveyor rails 24. The dispensing head is then lowered in the z direction until it is in contact with the stencil 16. Pressurized air is provided to the cartridges 104 while the dispensing head is moved in the x direction across the stencil 16. The pressurized air forces solder paste out the cartridges and creates pressure on the solder paste in the dispensing head forcing solder paste from the dispensing slot of the dispensing head through apertures in the stencil 16 and onto the circuit board 26. Once the dispensing head 100 has fully traversed the stencil 16, the circuit board is lowered back onto the conveyor rails 24 and transported from the printer so that a second circuit board may be loaded into the printer. To print on the second circuit board, the dispensing head is moved across the stencil in the direction opposite to that used for the first circuit board. Alternatively, a squeegee arm (as described below) could swing in to contain the solder paste in the dispenser, and the dispenser can then be lifted in the z direction and moved back to its original position to prepare to print on the second circuit board using a similar direction stroke. Further description of the operation and construction of the dispensing head 100 are provided below with reference to FIGS. 2–5.

The dispensing head 100 includes a housing 105 coupled to two supporting arms 106. At one end of each of the supporting arms 106 are thumbscrews 22 that provide for easy removal and installation of the dispensing head 100. The housing 105 has two ports 108 that are adapted to receive a standard SEMCO solder paste cartridge. In the illustrative embodiment described herein, the dispensing head is adapted to receive two SEMCO cartridges, however, the dispensing head may be adapted to include more or less cartridges than the two shown herein. The number of cartridges used is selected based on the length L of the dispensing head and the capacity of the cartridge used. The length L is determined in part based on the width of the circuit boards to be printed upon. If the size of the circuit board changes, then the dispensing head may be replaced by a new dispensing head having a length L sized for the new circuit boards. The effective length of the slot 102 may also be reduced to accommodate smaller circuit boards by partially covering a portion of the slot.

The housing 105 includes a cylindrical chamber 110 in which solder paste received from the SEMCO cartridges is stored prior to being dispensed onto the stencil. In one embodiment, the interior walls of the chamber 110 are coated with a material having a low coefficient of friction. Other materials, having a wide range of coefficients of friction, are used for the coating to create a desired laminar flow of solder paste in the chamber. In one embodiment, a number of different coatings having a variety of coefficients of friction may be used to create the desired laminar flow. At the slot 102, the housing has two inwardly facing blades 112 and 114. Each of the inwardly facing blades has a length approximately equal to the length L of the slot, a width equal to approximately 0.38 inches, and a thickness of approximately 0.004 to 0.010 inches. Each of the blades 112 and 114, in one embodiment of the present invention, is made from spring steel. At each end of the blades is a side dam 103. While other materials such as plastic could be used to make the blades, the use of spring steel provides long life with continued resiliency. Each of the blades is arranged to provide an angle of approximately 15 degrees between the blade and the top surface of the stencil. Depending in part on the material used to make the blades and the speed at which the material dispenser traverses the stencil, the blades could be oriented at angles other than 15 degrees.

The dispensing head 100, in one embodiment of the present invention, further includes a pressure sensor 116 and a temperature controller 120. Incorporated within the temperature controller is a thermoelectric device and a temperature sensor. The pressure sensor 116 and the temperature controller 120 are coupled to the controller 14 through cables 118 and 122 respectively. The controller 14 is configured to measure the pressure and the temperature of the solder paste within the chamber 110 based on signals received from the sensors, and the controller controls the pressure and temperature by adjusting the force applied to the solder paste in the cartridges and by controlling the thermoelectric device contained in the temperature controller. In one embodiment, the pressure of the solder paste is maintained in the chamber by applying pressurized air at approximately 1–25 pounds per square inch to each of the cartridges 104. The temperature of the solder paste in the chamber is maintained during the printing operation at approximately 68 degrees Fahrenheit. In one embodiment, the pressure sensor is implemented using a pressure transducer with a programmable regulator and the temperature controller is implemented using a temperature probe with a thermoelectric device that can provide cooling as well as heating of the solder paste.

As discussed above, when the dispensing head is in the lowered printing position so that it is in contact with the stencil, the stencil printer 10 operates by forcing solder paste from the dispensing head 100 onto the stencil using air pressure applied to each of the SEMCO cartridges as the dispensing head moves across the stencil. In the printing position, the blades 112 and 114 contact the top surface of the stencil. For each direction that the dispensing head moves across the stencil, one of the blades 112 and 114 will be a trailing blade and will scrape any excess solder paste off the stencil. For example, when the dispensing head 100 moves in the direction of arrow 122 in FIG. 3, blade 112 will be the trailing blade removing any excess solder paste from the stencil. The orientation of the blades and the use of a cylindrical chamber in the dispensing head causes the solder paste within the chamber 110 to roll or flow in the direction of arrow 124 when the dispensing head is moved in the direction of arrow 122. The movement of the solder paste within the chamber causes mixing and shearing of the solder paste which helps to maintain the desired temperature and viscosity of the solder paste. The coating for the internal walls of the chamber 110 allows the solder paste to move freely within the chamber.

At the conclusion of printing, when it is desired to lift the dispensing head off of the stencil, the controller 14 turns off the pressurized air source, prior to lifting the dispensing head. This causes the solder paste to remain in the chamber 110 when the dispensing head is lifted and effectively reduces the amount of solder paste that is left on the stencil when printing is complete.

Figure 6:
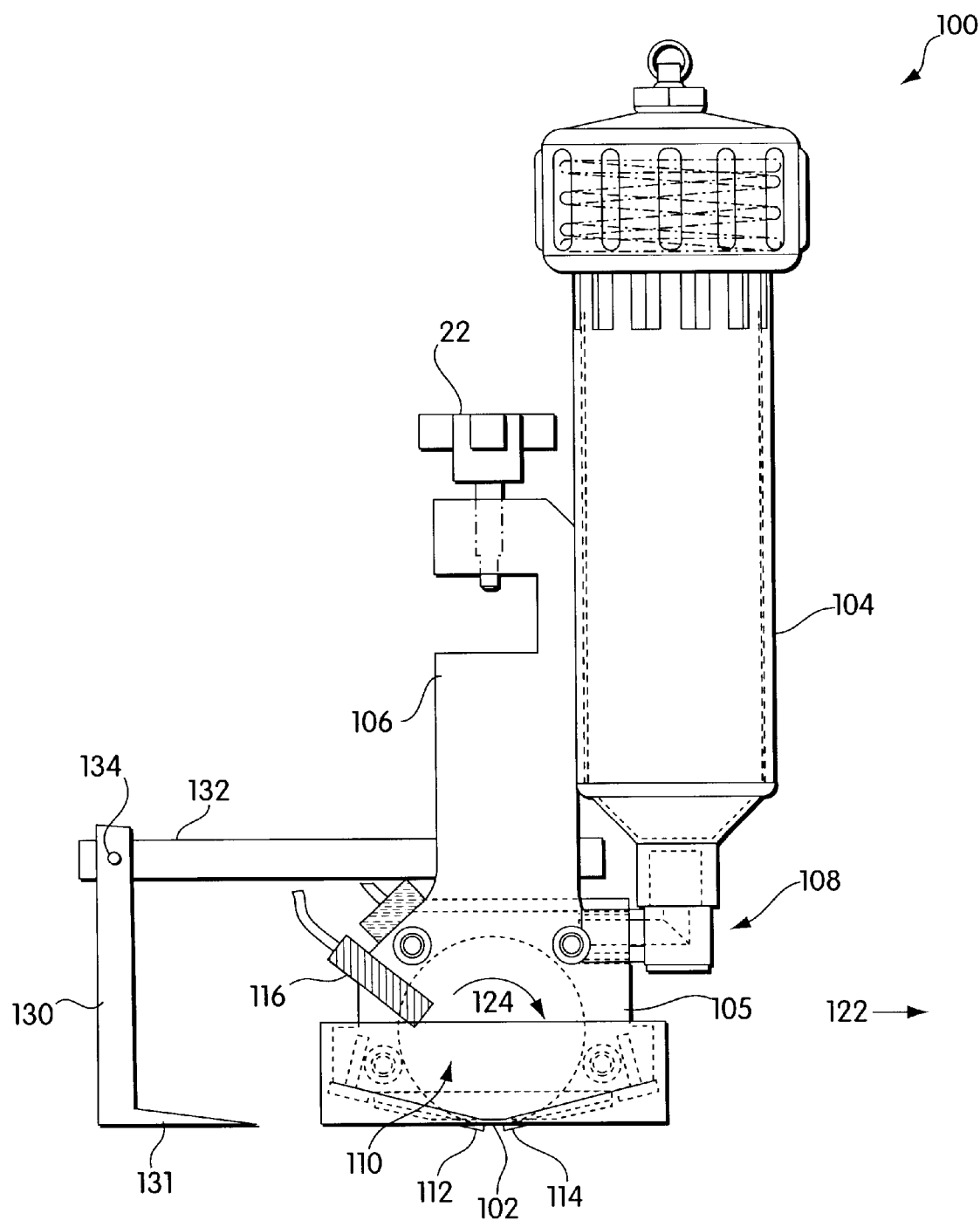
FIG. 6 shows a side view of the material dispenser with a solder gathering arm.

To further reduce the amount of residual solder paste on the stencil, a solder gathering squeegee arm may be used to remove excess solder paste. One example of a solder gathering squeegee arm that could be used in embodiments of the present invention is described in U.S. Pat. No. 5,044,306, which is incorporated herein by reference. FIG. 6 shows a solder gathering arm 130 incorporated into the dispensing head 100. The solder gathering arm includes a squeegee 131. The solder gathering arm is mounted to a bracket 132 which in turn is mounted to one or both of the supporting arms 106. The solder gathering arm is mounted to the bracket 132 using a rotatable joint 134, and the bracket 132 is movable with respect to the supporting arms 106 in the direction shown by arrow 122.

The solder gathering arm operates as follows. When the dispensing head 100 is lifted slightly off of the stencil, the bracket 132 is moved in the direction of arrow 122, and the solder gathering arm is rotated in the direction shown by arrow 136 causing the squeegee 131 to scrape along the stencil and remove any excess solder on the stencil. The rotation of the solder gathering arm and the movement of the bracket 132 is accomplished using motors or actuators under the control of the controller 14.

In embodiments of the present invention, instead of using the solder gathering arm, the blades 112 and 114 may be attached to motors or actuators that under the control of the controller cause the blades to move towards each other, scraping any excess solder paste from the screen and completely closing the slot 102. Alternatively, a pair of movable blades, in addition to blades 112 and 114, may be mounted to the dispensing head and be movable towards each other to scrape excess solder paste from the stencil.

Figure 7:
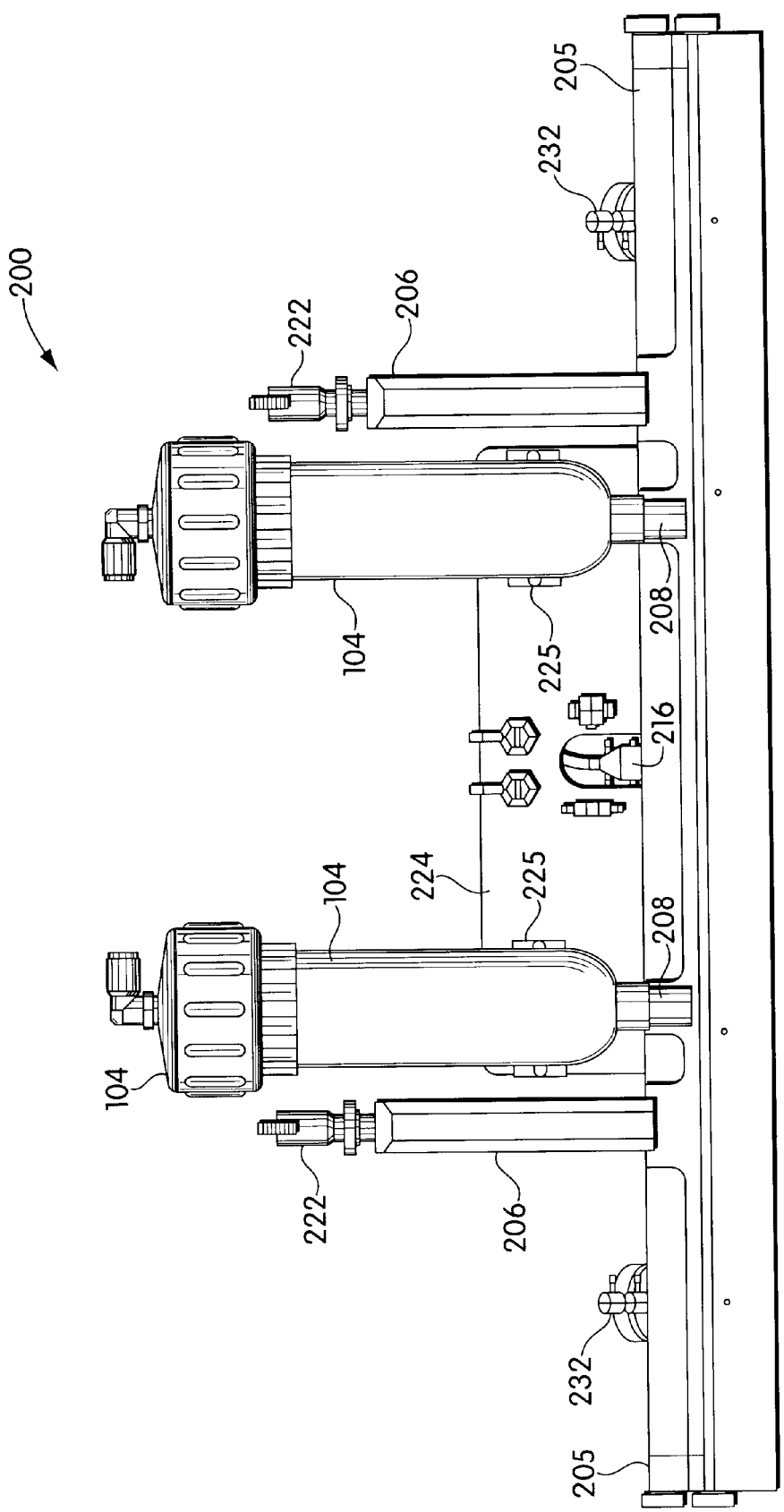
FIG. 7 shows a front view of another embodiment of a dispensing head used in the stencil printer of FIG. 1.
Figure 8:
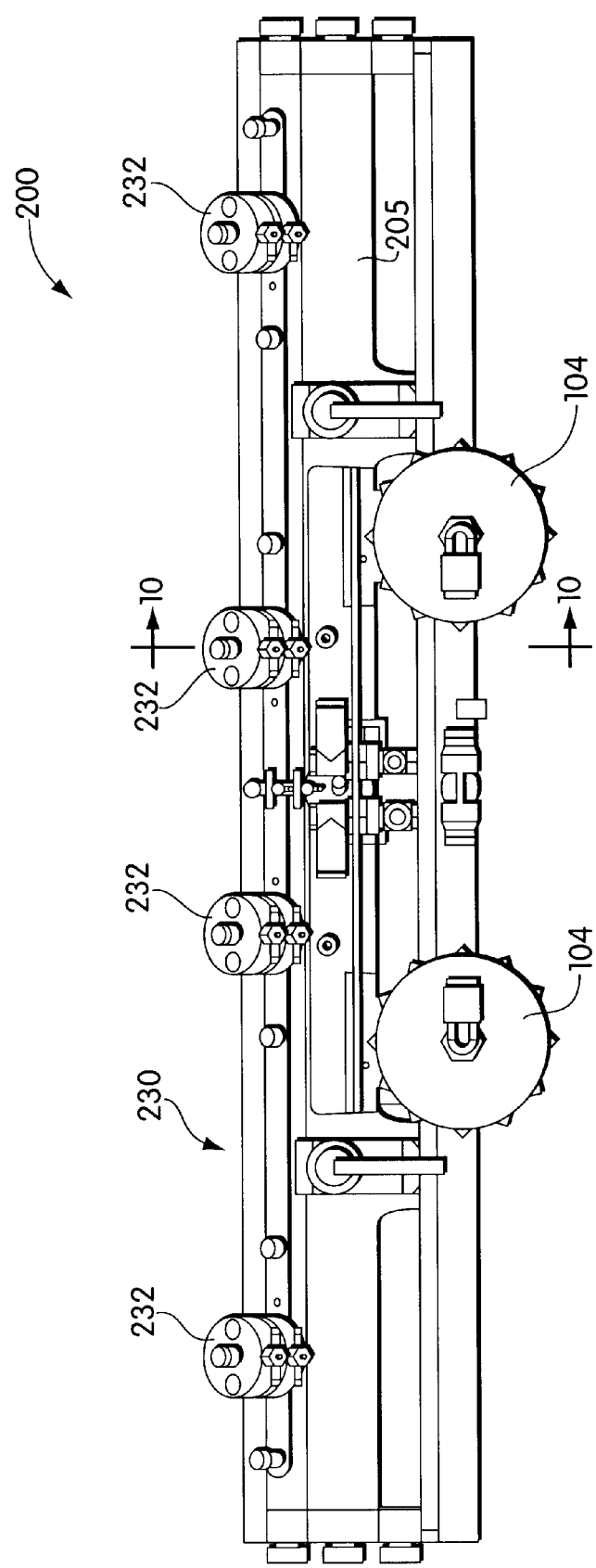
FIG. 8 shows a top view of the dispensing head of FIG. 7.
Figure 9:
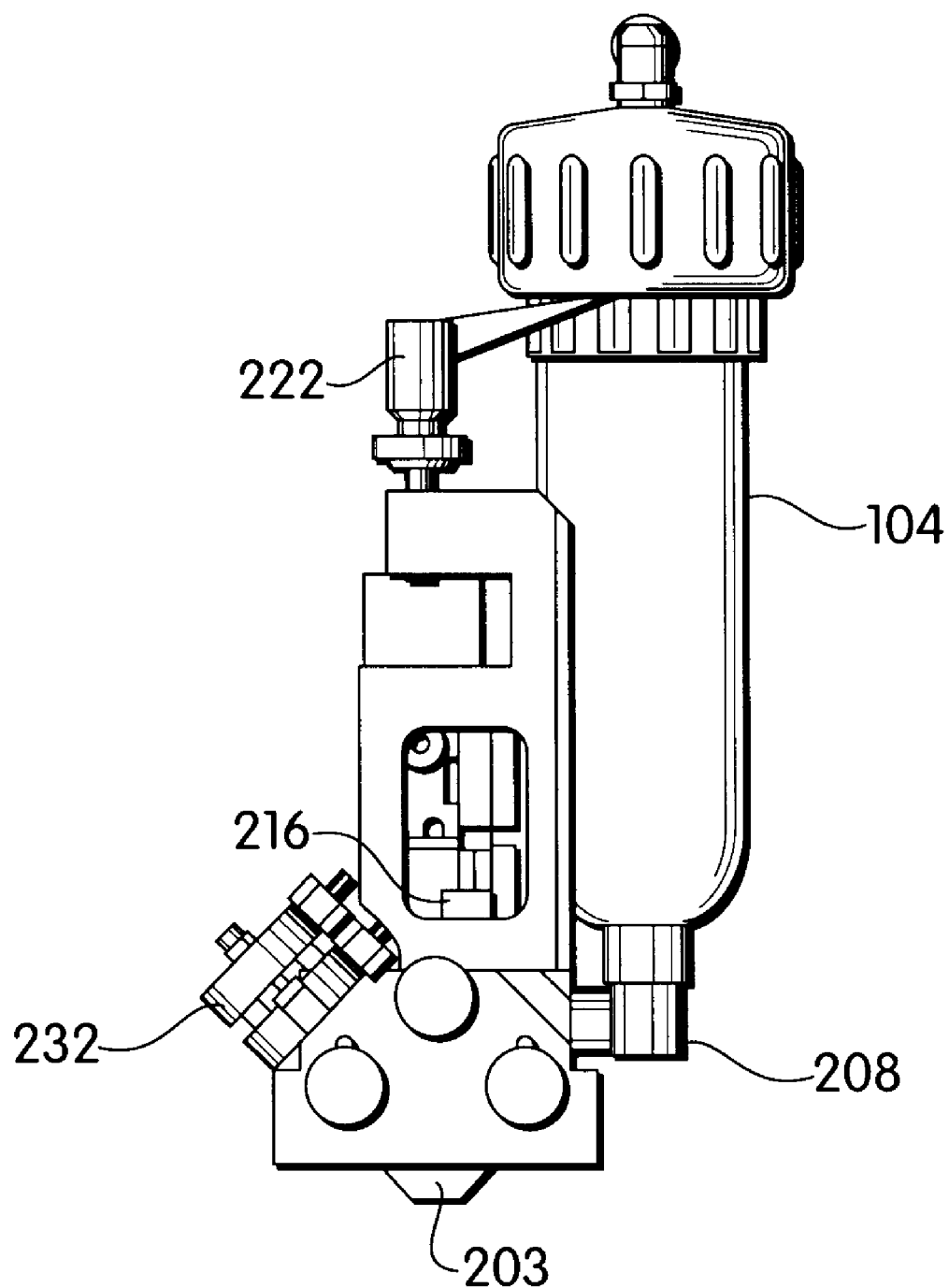
FIG. 9 shows a side view of the dispensing head of FIG. 7.
Figure 10:
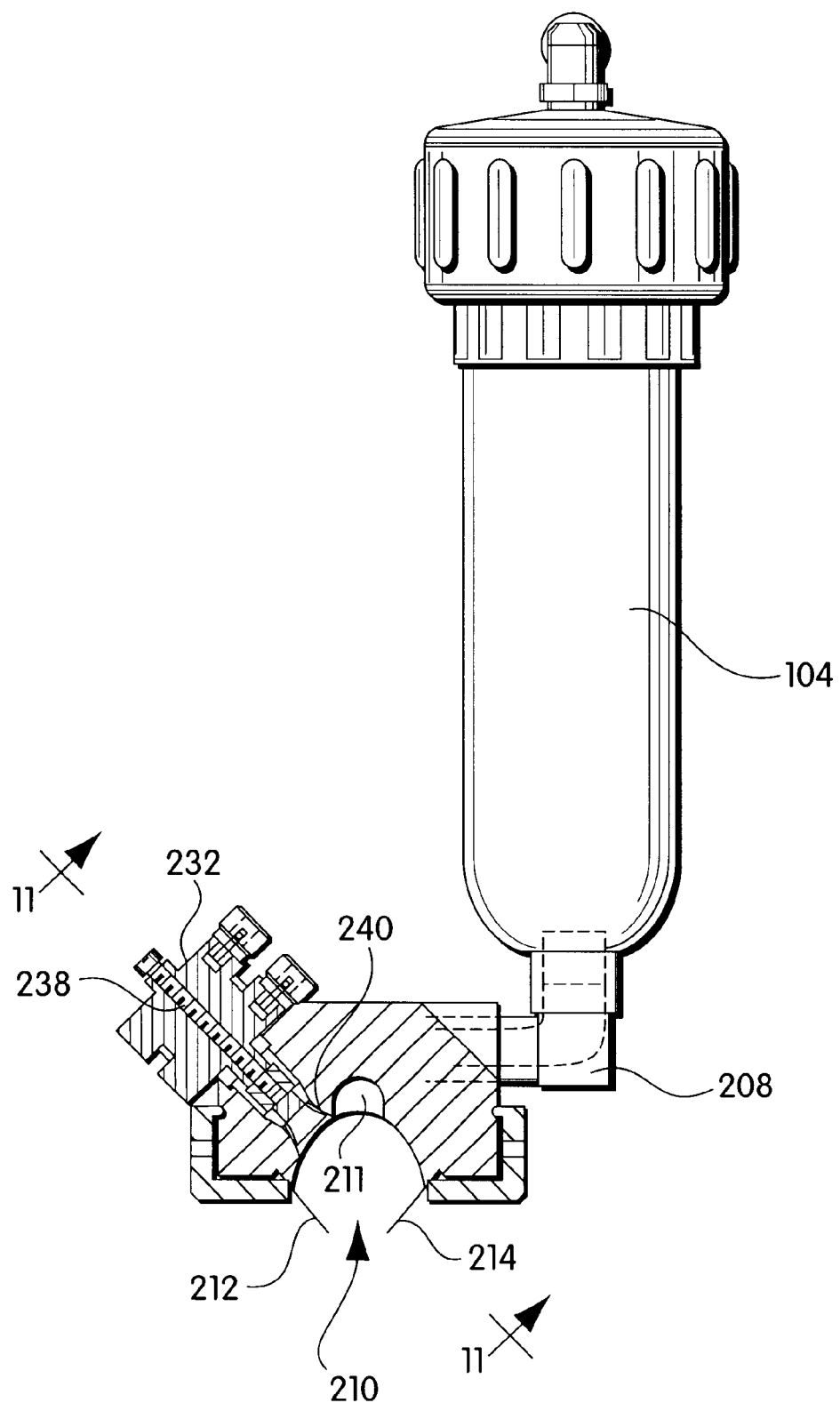
FIG. 10 shows a cross-sectional side view of the dispensing head taken along line 10-10 of FIG. 8.

In another embodiment of the present invention, which will now be described with reference to FIGS. 7–13, pressure is reduced within the chamber of a dispensing head to draw excess solder paste into the chamber at the conclusion of printing. FIG. 7 shows a side view of a dispensing head 200 in accordance with this embodiment of the invention. The dispensing head 200 is similar to dispensing head 100 and is mounted to the printer using two thumb screws 222 coupled to two supporting arms 206. The dispensing head 200, like dispensing head 100, is designed to accommodate two standard solder paste cartridges 104, which are mounted to ports 208. The dispensing head includes a bracket 224 to which conductive proximity switches 225 are mounted. The conductive proximity switches detect when the solder paste level in the cartridges drops below a predetermined level, and at that time, further printing is prevented and an indication is provided to an operator of a low solder paste condition. In one embodiment, the conductive proximity switches are implemented using switches capable of detecting a conductive material, such as those available from Omron Corporation under part no. E2K-F 10MC2. In other embodiments, more or less solder paste cartridges may be used.

Figure 11:
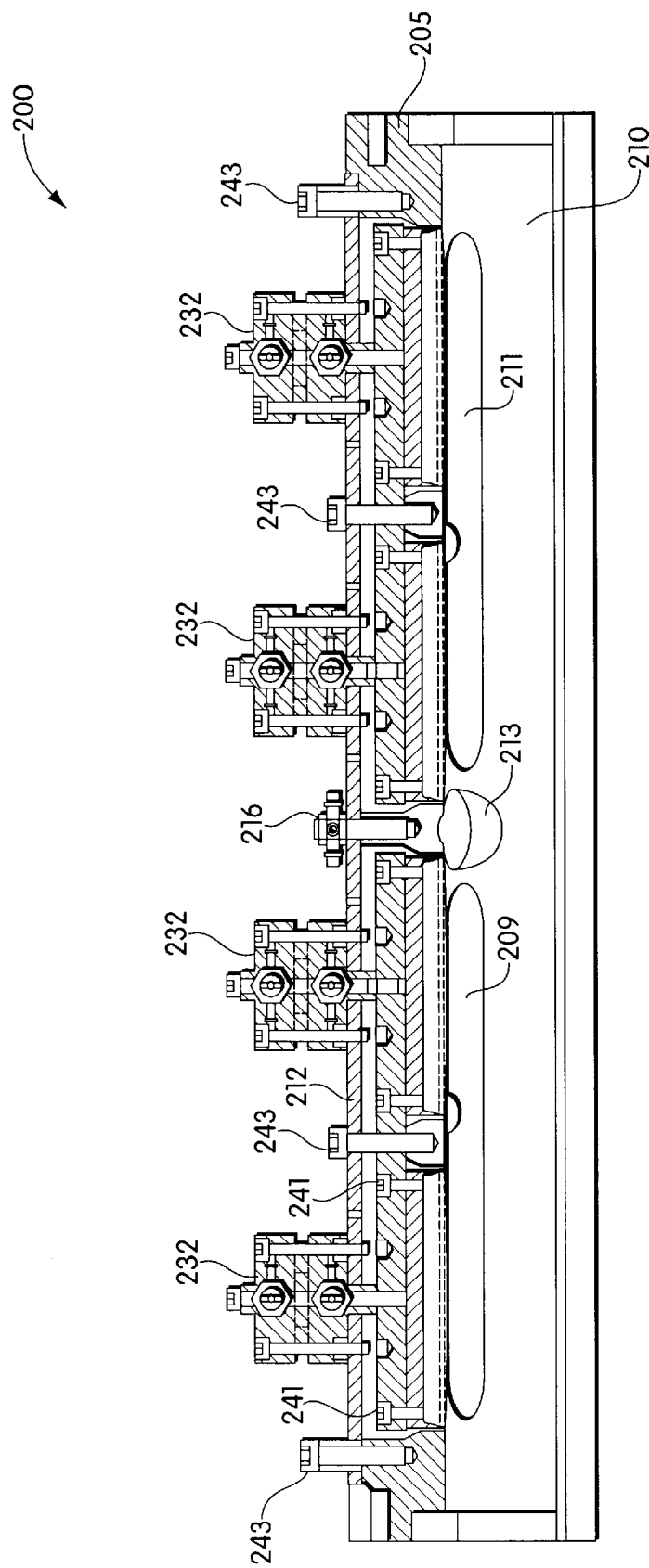
FIG. 11 shows a cross-sectional view taken along line 11—11 of FIG. 10.
Figure 12:
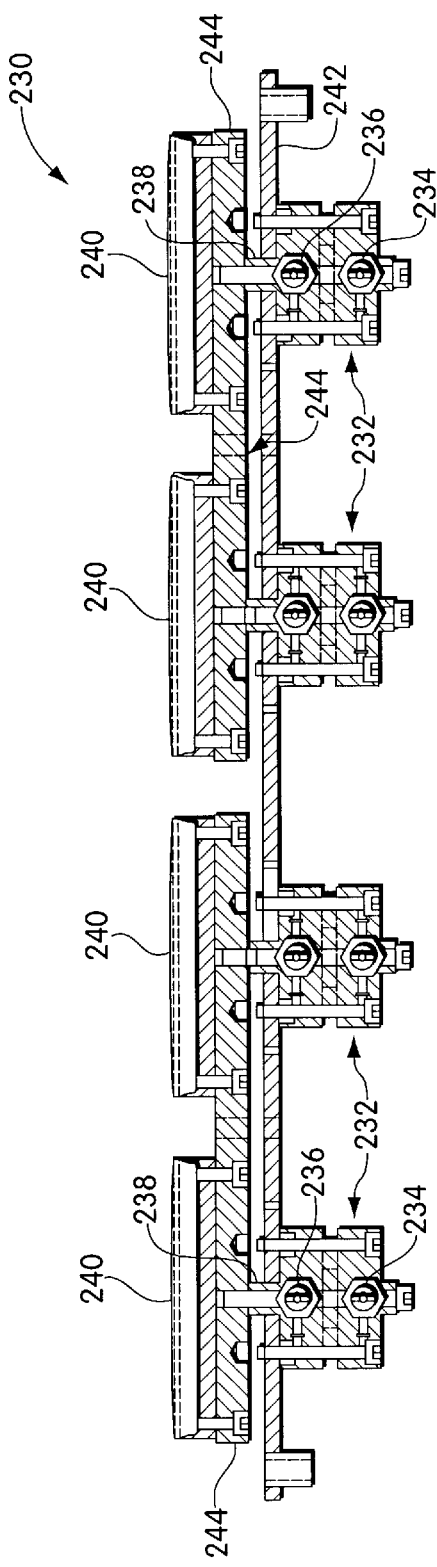
FIG. 12 shows a side view of a retraction assembly used in the dispensing head of FIG. 7.
Figure 13:
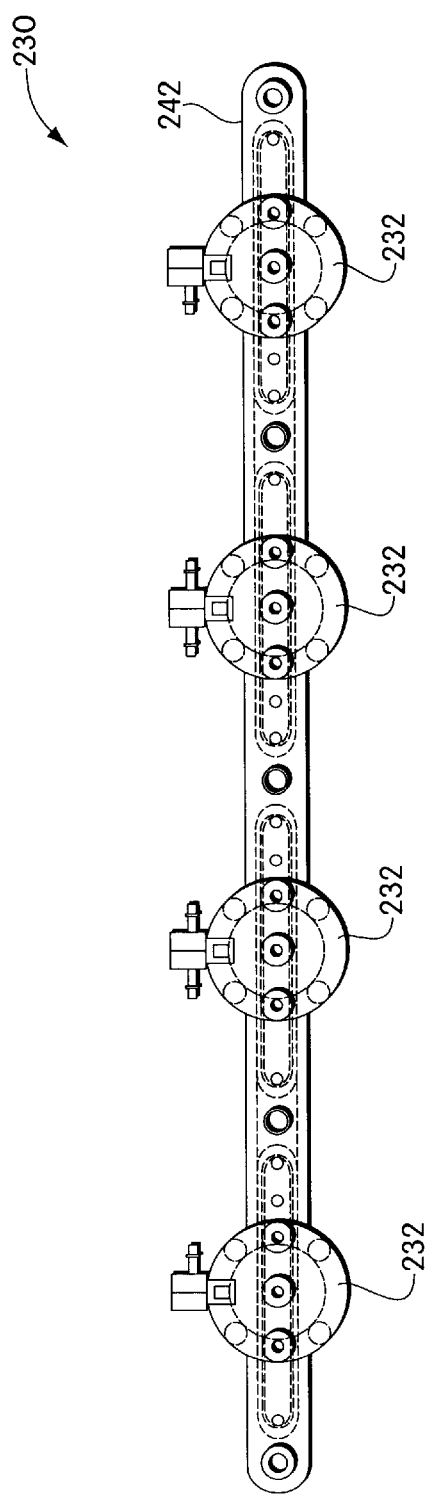
FIG. 13 shows a top view of the retraction assembly of FIG. 12.

The dispensing head 200 has a housing 205 containing a cylindrical chamber 210. The housing has two ports 208 for passing solder paste from the cartridges 104 into the cylindrical chamber 210. Similar to dispensing head 100, dispensing head 200 has blades 212 and 214 and side dams 203. In one embodiment, the side dams have a lower portion and an upper portion. The lower portion is formed from a relatively rigid material (such as urethane having a durometer of 70 shore D) to prevent wear, while the upper portion is made from a more compliant material (such as urethane having a durometer of 10–15 shore A) to allow slight compression of the side dams as the dispensing head is moved across the stencil. In addition, the dispensing head 200 has a pressure sensor 216 to detect pressure in the chamber 210 and a temperature sensor to detect temperature of the solder paste in the chamber. Within the housing, as best seen in FIG. 11, adjacent to the chamber are channels 209, 211 and 213. Channels 209 and 211 are used to more evenly distribute solder paste from the cartridges through the ports 208 to the chamber and channel 213 enables the pressure sensor 216 to measure pressure within the chamber.

Dispensing head 200 differs from dispensing head 100 in that it includes a solder paste retraction assembly 230. As described below in greater detail, after the completion of printing on a substrate, the solder paste retraction assembly causes the effective volume of the chamber 210 to increase to create a negative pressure within the chamber which causes excess solder paste to be retracted into the chamber.

The retraction assembly 230 includes four actuators 232 having pistons 238 coupled to two plunger mounting brackets 244. Each of the plunger mounting brackets 244 is coupled to two elongated, unshaped plungers 240 using screws 241. Each of the actuators is mounted to an actuator mounting bracket 242 which is mounting to the housing 205 using screws 243.

Figure 14:
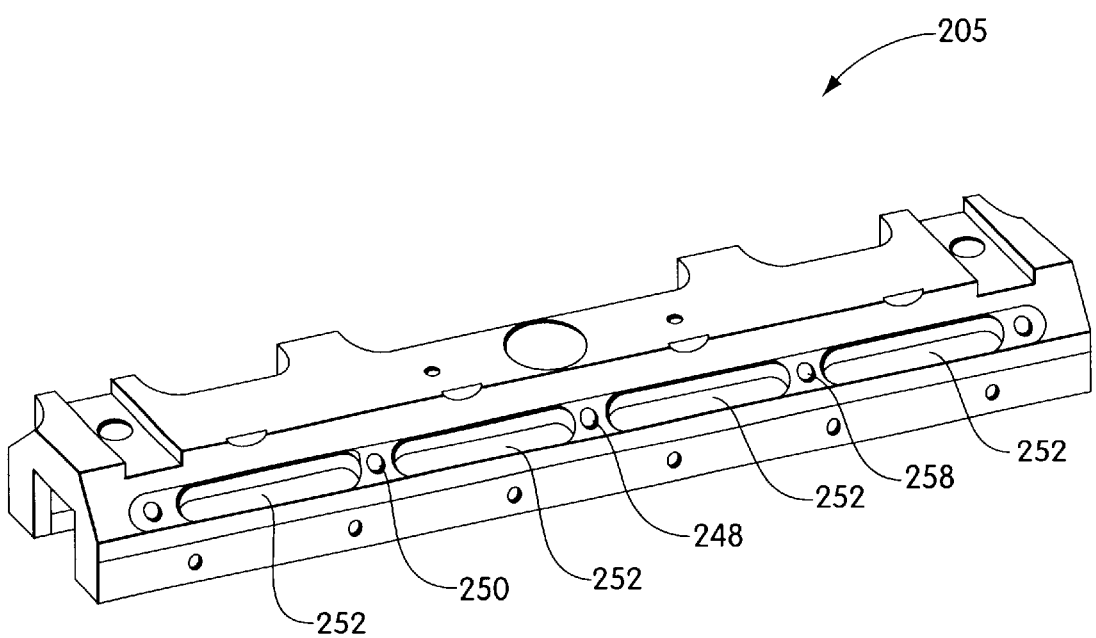
FIG. 14 shows a perspective view of the housing of the dispensing head of FIG. 7 with the retraction assembly removed.

As best seen in FIG. 14, which shows the housing 205 with the retraction assembly and cartridges removed, the housing 205 has an upper channel 248, two intermediate channels 250 and four lower slots 252. The upper channel extends across the housing and is sized to accommodate the actuator bracket 242. The two intermediate channels 250 are formed within the actuator channel and are sized to accommodate the plunger mounting brackets 244. Two of the four lower slots 252 are formed in each of the intermediate channels 250. Each of the lower slots is sized to accommodate one of the plungers 240.

In one embodiment of the present invention the actuators are implemented using double acting, pancake air cylinders having a ⁹⁄₁₆ inch diameter and a ⅛ inch stroke, available from Bimba of Monee, IL under part no. FOD-020.125-H. These actuators have two pressurized air inlet ports 234 and 236 that in embodiments of the present invention are coupled to controllable sources of pressurized air to control movement of the pistons 238. Pressurized air is provided to inlet ports 234 of the actuators to extend the pistons, and pressurized air is provided to inlet ports 236 to retract the pistons.

In one embodiment, the u-shaped plungers are made from a resilient material such as urethane having a durometer of 65–70 shore D. In other embodiments other materials may be used for the plungers. The plungers provide a seal in the elongated slots 252 to prevent solder paste in the chamber from escaping through the slots 252.

The operation of the dispensing head 200 will now be described. The dispensing head 200 operates during a printing cycle in substantially the same manner as dispensing head 100 to print a pattern of solder paste, or some other substance, onto a substrate, such as a circuit board, using a stencil having the pattern defined thereon. At the conclusion of printing, pressurized air is provided to inlet ports 236 to retract each of the pistons 238 into the actuators and cause each of the plungers 240 to be raised in the elongated slots 252. When the plungers are raised, the effective volume of the chamber 210 increases creating a momentary vacuum condition in the chamber that draws the solder paste into the chamber. Prior to the start of printing on another substrate, pressurized air is provided to inlet ports 234 to extend each of the pistons from the actuators and cause the plungers to be lowered in the elongated slots 252.

In one embodiment of the present invention used for printing solder paste, the pistons and the plungers are moved a distance of approximately 0.125 inches between the extended and retracted positions. In this embodiment, the volume of the chamber increases by approximately 2% to 4% when the pistons are retracted. In other embodiments, depending on characteristics of the material being printed, and depending on the design of the chamber, it may be desirable to change the volume of the chamber by other values.

In the illustrative embodiment of the dispensing head 200 described above, four plungers with four actuators are used in the retraction assembly, and the housing includes two intermediate channels and four lower slots to accommodate the retraction assembly. In other embodiments, it may be desirable to use more or less plungers, actuators, intermediate channels and lower slots depending on the dimensions of the printing head and chamber. In addition, in other embodiments of the present invention, devices other than plungers may be used to expand the volume of the chamber.

In the illustrative embodiment described above, air actuators are used to extend and retract the pistons. As understood by those skilled in the art, in other embodiments, other mechanisms, such as electrical motors, could be used to move the pistons.

In embodiments of the present invention that do not include the dispensing head 200 with the retraction assembly, it has been found that solder paste can leak from the chamber after printing has occurred when the substrate is removed from the stencil. Solder paste that leaks from the chamber is at times able to flow between the stencil and the blades and undesirably collect on the back sides of the blades. The use of the retraction assembly to draw solder paste into the chamber after printing is effective in reducing the leaking of solder paste from the chamber.

U.S. patent application Ser. No. 08/598,288, filed on Feb. 8, 1996, assigned in part to the assignee of the present application, and incorporated herein by reference, discloses a screen printer having a solder applicator that applies solder paste to a stencil. In one embodiment, the solder applicator includes a rotatable member that mixes solder paste in the solder applicator. Embodiments of the present invention may include a rotatable member within the chamber to assist in the mixing of solder paste in the chamber.

Embodiments of the present invention described above may also be incorporated in a dual track stencil printer such as those described in U.S. patent application Ser. No. 08/802,934, filed Feb. 21, 1997, which is incorporated herein by reference.

Embodiments of the present invention described above include standard SEMCO cartridges for loading solder paste into the dispensing head. Other removable cartridges may be used in place of the SEMCO cartridges. However, it is desirable to use a standard replaceable cartridge.

The chamber of dispensing heads in embodiments of the present invention have been described as being cylindrical. The dispensing head need not be cylindrical, but rather, other shapes having a substantially circular cross-section to allow rolling of the solder paste within the chamber to create a substantially laminar flow may also be used. In addition, in one embodiment, the chamber is generally kidney-shaped, and the specific shape is programmable for controlling the flow of solder paste within the chamber based on the specific solder paste material used, the speed of the dispensing head across the stencil and based on any other factors.

The dispensing head of embodiments of the present invention is described as being used with a stencil printer. Stencil printers such as the Ultraprint 3000 stencil printer and the AP Series stencil printer, both available from MPM Corporation of Franklin, Mass. can readily be adapted for use with embodiments of the present invention.

Embodiments of the present invention overcome problems associated with prior art stencil printers by providing dispensing heads and stencil printers that effectively remove excess solder paste from the stencil. In addition, the pressure applied to the solder paste to force it through apertures in the stencil is precisely controlled using a closed loop feedback system.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A printer for printing a viscous material at predetermined positions forming a pattern on a substrate, the printer comprising:
    a frame;
    a device, mounted to the frame, having a number of perforations arranged to form the pattern;
    a support apparatus, coupled to the frame, that supports the substrate in a printing position beneath the device; and
    a material dispenser having a ridged chamber to contain the viscous material to be printed on the substrate, the chamber having an opening through which the viscous material is dispensed, the material dispenser being coupled to the frame, positioned over the device, and constructed and arranged to dispense the viscous material through the perforations in the device and onto the substrate, the material dispenser having a retracttion device, extendable into the chamber, that prevents leakage of the viscous material form the opening after dispensing is complete, the retraction device being configured and arranged to increase the volume of the rigid chamber after dispensing, the material dispenser further having at least one port and a removable cartridge coupled to the port, the removable cartridge containing material to be dispensed and having an inlet to receive pressurized air to force the material from the cartridge through the port and out of the opening of the chamber.

2. The printer of claim 1, wherein the retraction device includes at least one plunger that is extendable into the chamber to vary a volume of the rigid chamber.

3. The printer of claim 2, wherein the retraction device includes an actuator coupled to the plunger to control movement of the plunger.

4. The printer of claim 3, wherein the actuator has a first air inlet and a second inlet, and wherein the actuator is constructed and arranged to provide movement of the plunger in a first direction upon the application of pressurized air at the first inlet and to provide movement of the plunger in a second direction upon the application of pressurized air at the second inlet.

5. The printer of claim 4, wherein the material dispenser is constructed and arranged to be movable along a first axis across the device while the viscous material is being dispensed from the chamber.

6. The printer of claim 5, wherein the chamber has a cylindrical axis extending along a length of the chamber, and wherein the cylindrical axis is orthogonal to the first axis.

7. The printer of claim 6, wherein the material dispenser includes a pressure sensor to sense pressure within the chamber, and wherein the printer further comprises a controller coupled to the pressure sensor that senses the pressure within the chamber and controls the pressurized air provided through the port to maintain the pressure within the chamber at a desire value.

8. The printer of claim 7, wherein the viscous material is solder paste and the device is a stencil for printing solder paste on a circuit board.

9. The printer of claim 1, wherein the retraction device includes a plurality of plungers disposed along a portion of the chamber.

10. A printer for printing a viscous material at predetermined positions forming a pattern on a substrate, the printer comprising:
    a frame;
    a device, mounted to the frame, having a number of perforations arranged to form the pattern;
    a support apparatus, coupled to the frame, that supports the substrate in a printing position beneath the device;
    a material dispenser having a rigid chamber to contain the viscous material to be printed on the substrate, the chamber having an opening through which the viscous material is dispensed, the material dispenser being coupled to the frame, positioned over the device, and constructed and arranged to dispense the viscous material through the perforations in the device and onto the substrate;
    means for retaining the viscous material in the chamber after dispensing is complete including means for increasing a volume of the rigid chamber,
    a cartridge coupled to the chamber that provides material to the chamber; and
    means for applying pressure to the viscous material in the cartridge to force material from the cartridge into the chamber and out of the opening of the chamber.

11. The printer of claim 10, wherein the means for retaining includes a plurality of plungers disposed within the chamber.

12. A method for printing a pattern of viscous material on a substrate using a dispenser having a rigid chamber with an inlet to receive visous material and an outlet from which viscous material is dispensed, the chamber having a volume, the method comprising steps of:
  positioning the dispenser over the substrate;
  extending a plunger into the chamber to contact the material in the chamber and decrease the effective volume of the chamber;
  applying pressure to the viscous material in the chamber to dispense viscous material form the outlet of the chamber onto the substrate;
  relieving the pressure applied to the viscous material to discontinue dispensing;
  expanding the volume of the chamber to retain the viscous material in the chamber by at least partially retracting the plunger form the chamber;
  coupled a removable cartridge containing the viscous material in the chamber by at an outlet of the removable cartridge is coupled to the inlet of the chamber.

13. The method of claim 12, wherein in the step of applying pressure, air pressure is supplied to the removable cartridge.

14. A system for depositing a viscous material at predetermined position forming a pattern on a substrate, the system comprising:
  a frame;
  a device, mounted to the frame, having a number of perforations arranged to form the pattern;
  a support apparatus, coupled to the frame, that supports the substrate in a printing position beneath the device; and
  a material dispenser coupled to the frame and including:
    a chamber to contain the viscous material to be printed on the substrate, the chamber having an opening through which the viscous material is dispensed onto the substrate;
    a retraction device, extendable into the chamber, that prevents leakage of the viscous material from the opening after dispensing is complete, the retraction device increasing the volume of the chamber after dispensing;
    a cartridge coupled to the chamber and containing material to be dispensed, the cartridge having an inlet to receive pressurized air to force the material from the cartridge into the chamber and out of the opening of the chamber.

15. The system of claim 14, wherein the retraction device includes a plurality of plungers that are extendable into the chamber to vary the volume of the chamber.

16. The system of claim 15, wherein the plurality of plungers are disposed along a portion of the chamber opposite the opening.

17. The system of claim 16, wherein the material dispenser is movable across the device in a direction along a first axis, and wherein the chamber is substantially cylindrical having a cylindrical axis that is perpendicular to the first axis.

18. The system of claim 17, wherein the plurality of plungers are disposed along an axis that is parallel to the cylindrical axis.

* * * * *

UNITED STATES PATENT AND TRADEMARK OFFICE
CERTIFICATE OF CORRECTION

PATENT NO. : 6,324,973 B2  
DATED : December 4, 2001  
INVENTOR(S) : Mark Rossmeisl et al.

It is certified that error appears in the above-identified patent and that said Letters Patent is hereby corrected as shown below:

<u>Column 11,</u>  
Line 55, delete "ridged" and insert -- rigid --;  
Line 62, delete "retracttion" and insert -- retraction --.

<u>Column 13,</u>  
Line 11, delete "form" and insert -- from --;  
Line 18, delete "coupled" and insert -- coupling --;  
Line 19, delete "in the chamber by at" and insert -- to the dispenser such that --.

Signed and Sealed this

Twelfth Day of November, 2002

*Attest:*

*Attesting Officer*

JAMES E. ROGAN  
*Director of the United States Patent and Trademark Office*